United States Patent [19]
Chang et al.

[11] 3,950,732
[45] Apr. 13, 1976

[54] SINGLE TECHNOLOGY TEXT EDITING SYSTEM

[75] Inventors: Hsu Chang, Yorktown Heights, N.Y.; Tien C. Chen, San Jose, Calif.; Share-Young Lee, Lake Mohegan, N.Y.; Chin Tung, San Jose, Calif.

[73] Assignee: International Business Machines Corporation, Armonk, N.Y.

[22] Filed: May 14, 1974

[21] Appl. No.: 469,926

[52] U.S. Cl.......................... 340/172.5; 340/174 TF
[51] Int. Cl.² .................. G11C 19/00; G11C 11/14
[58] Field of Search.. 342/174 TF, 174 SR, 174 CL, 342/172.5, 173 R

[56] References Cited
UNITED STATES PATENTS

| | | | |
|---|---|---|---|
| 3,670,313 | 6/1972 | Beausoleil et al. | 340/174 CL |
| 3,701,132 | 10/1972 | Bonyharo et al. | 340/174 CL |
| 3,737,881 | 6/1973 | Cordi et al. | 340/174 CL |
| 3,760,387 | 9/1973 | Chang et al. | 340/174 CL |
| 3,772,658 | 11/1973 | Sarlo | 340/173 SM |
| 3,797,002 | 3/1974 | Brown | 340/174 CL |

*Primary Examiner*—Vincent P. Canney
*Attorney, Agent, or Firm*—Jackson E. Stanland

[57] ABSTRACT

A text editing system is described which is comprised of single technology elements. That is, the system is comprised of dynamic shift registers which are entirely implemented with either magnetic bubble domain devices or charge coupled devices. These shift registers can be randomly accessed using write and read decoders to provide great flexibility in entry, retrieval, and restoring of data. An editing shift register is used for text editing functions, such as insertion of data, deletion of data, etc. This editing shift register performs the data manipulation functions by using techniques such as freezing of data bits and bypassing of data bits in order to change the order of the data and to close gaps which may occur in the data. The shift registers used for storage and the editing shift register are characterized in that all data manipulation functions and all accessing functions do not require a change in the sequence of the drive field used to move the data bits.

11 Claims, 9 Drawing Figures

SYSTEM ORGANIZATION

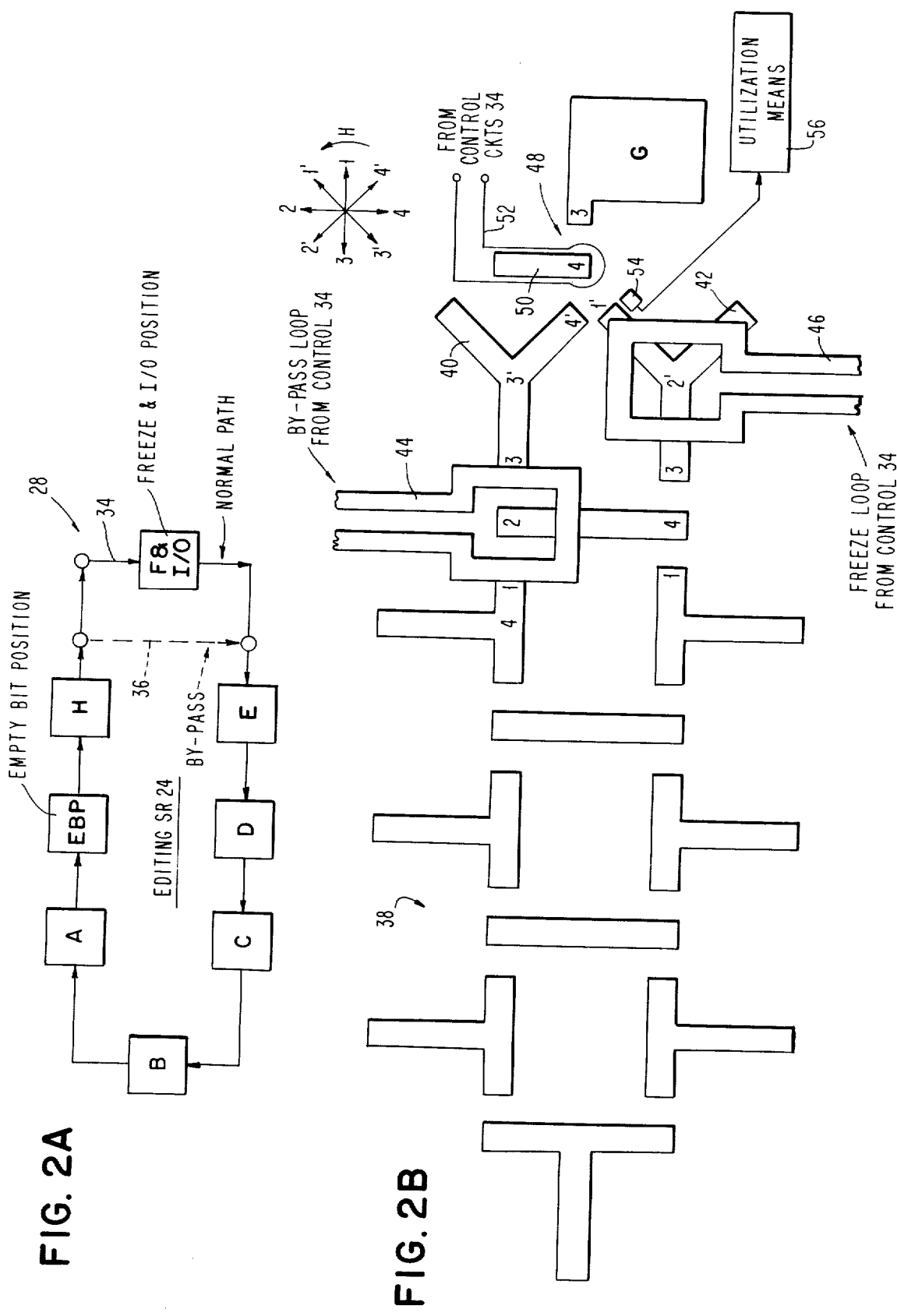

SINGLE TECHNOLOGY TEXT EDITING SYSTEM

CROSS-REFERENCE TO RELATED APPLICATION

Copending application Ser. No. 469,927 filed the same day as the present application, describes a text editing system using an editing shift register of the type shown in the present application, together with means for providing sequential or random access of information in the text.

BACKGROUND OF THE INVENTION

1. Field of the Invention

This invention relates to text editing systems which can be implemented by magnetic bubble domain devices or by charge coupled devices, and more particularly to a dynamic shift register text editing system which will perform all data manipulation functions with a constant sequence of applied drive pulses.

2. Description of the Prior Art

Current keyboard text editing facilities use mechanically accessed magnetic media for storage and semiconductor devices for editing. Problems of speed discrepancy and synchronization dictate the use of a semiconductor random-access memory as a buffer. This complex system requires considerable semiconductor logic devices for control. As will be appreciated, this type of approach requires several different technologies and necessitates suitable interfaces for these different technologies.

Magnetic bubble domain technology provides inexpensive, non-volatile, non-mechanical storage devices suitable for large capacity memories. Indeed, considerable attention has been paid to the memory applications of magnetic bubble domains, as is amply reflected in the published literature. However, bubble domains also offer switch capabilities as can be seen by referring to U.S. Pat. No. 3,701,125, which describes an on-chip memory-decoder system.

Some prior art in magnetic bubble technology describes reordering of data bits represented by bubble domain patterns. For instance, reference is made to the dynamically ordered magnetic bubble domain memories described in U.S. Pat. No. 3,670,313 and U.S. Pat. No. 3,797,002. Additionally, reference is made to U.S. Pat. No. 3,701,132. All of these prior art patents describe the relocation of bubble domain data bits in systems where the bubble domains are propagated by the use of a reorienting, in-plane magnetic field. However, the technique for reordering data in these prior art patents is based on magnetic field reversal or stoppage. This presents a significant difficulty in synchronization of data movement and in the design of circuits for the movement of bubble domains in an entire chip, where the reversal or stoppage of the magnetic field, intended for one part of the chip, nevertheless has an effect on all devices performing various functions in the magnetic chip. This means that specialized shielding mechanisms and/or propagation elements have to be designed in order to maintain control of the data at locations other than those where a reordering of data is to take place, and also that other processing functions requiring forward field are interrupted. Additionally, the use of a field reversal or stoppage of the magnetic field requires more complex peripheral electronic control circuits and does not permit the use of tank-circuit drives in order to obtain a large magnetic field energy which would be required for large storage capacity.

In addition to the shortcomings described above, the prior art does not take into consideration the introduction of a gap in the data bits which may be produced by different manipulative functions performed on the data. In a text editing system, the flexible manipulation of a gap which is produced when, for instance, data is deleted from a line of text, must be achieved. In the prior art patents where only the order of data is important, no attempt is made to adjust any gap, nor is there any concern about such a gap. In this regard, it should be noted that field reversal does not allow local control in a specified portion of the magnetic chip and is therefore not a technique which can be used to adjust a gap.

In the system proposed herein, these problems are solved using a novel text editing system. Additionally, a constant rotating magnetic field (of substantially constant amplitude) is used at all times in the proposed bubble domain system. Because this is done, the principles shown herein for magnetic bubble domains can be applied directly to charge coupled devices to achieve a corresponding system using charge coupled devices for the dynamic shift register storage. If field reversal were required, as is the case in the prior art, charge coupled devices could not be used. Consequently, the present system embodies broad principles which are applicable both to the magnetic bubble domain technology and to charge coupled device technology which is also a dynamic shift register type of storage.

As will be apparent, the proposed system offers flexible storage structures for facilitating the input, output, retrieval, and revision of data. Additionally, a wide range of data manipulation functions is achieved and the system provides for ready timing controls and character encoding.

Accordingly, it is a primary object of the present invention to provide a text editing system using dynamic shift registers, which does not require a reversal or stoppage of the drive fields applied for manipulation of data.

It is another object of this invention to provide a text editing system using magnetic bubble domains.

It is a further object of this invention to provide a text editing system using magnetic bubble domains wherein the magnetic drive field need not be stopped or reversed.

It is a still further object of this invention to provide a magnetic bubble domain text editing system which is totally on the magnetic chip.

It is a still further object of this invention to provide a text editing system which can be implemented in either magnetic bubble domain technology or charge coupled device technology.

It is another object of this invention to provide a magnetic bubble domain text editing system which can be used to perform editing on a character by character basis.

It is another object of this invention to provide a dynamic shift register text editing system using a single technology, which minimizes interface complexity.

It is a further object of this invention to provide a bubble domain text editing system which permits simultaneous operation of many functions while localized switching functions are occurring at the same time.

It is another object of this invention to provide a text editing system which is flexible and which can be adapted and designed to the user's own requirements.

It is still another object of this invention to provide a text editing system wherein the devices for editing and sorting data and the devices for storing information are compatible in design and can be hosted in the same storage medium to realize an integrated circuit.

BRIEF SUMMARY OF THE INVENTION

This text editing system is comprised of dynamic shift registers implemented with either magnetic bubble domain devices or charge coupled devices. A system using only a single technology is therefore provided which can be completely implemented on the same host medium. That is, the text editing components and the storage components can comprise different portions of the same host medium, whether that medium is a magnetic bubble domain medium or a semiconductor medium.

The system is broadly comprised of a plurality of storage shift rgisters for storing the text, a data entry device for producing patterns of information (such as bubble domains) which represent the text to be edited and an editing shift register. A write decoder receives the input pattern from the data entry device and places it into the storage shift registers as desired.

A read decoder is used for selectively removing information from any of the storage shift registers and for routing that information to an editing shift register. The editing shift register is the register in which the data manipulation functions are performed. It is comprised of an editing station where such functions as detection, insertion of new information, deletion of information, and exchange of information can be accomplished.

A control circuit provides address signals for the write decoder and for the read decoder and also is used to synchronize a means for creating a stabilizing magnetic field (if bubble domains are used) and the drive circuits which are used to move the bits of information. In the case of a magnetic bubble domain system, the drive circuits comprise means for producing a rotating magnetic field in the plane of the magnetic medium in which the bubble domains exist.

In additiion to the storage shift registers, spare shift registers can be provided for use whenever information is to be interchanged between any of the storage shift registers. In addition, these spare shift registers can be used to increase reliability, since they provide redundancy. To repair the apparatus or to avoid a defective shift register, the information normally to be stored in the defective shift register is sent to the spare shift register. This is easily done by changing an address in the decoder.

As will be apparent, all data manipulation functions can be performed without changing the sequence of the drive field used to move the bits representing information. These and other objects, features, and advantages will be more apparent from the following more particular description of the preferred embodiments.

BRIEF DESCRIPTION OF THE DRAWINGS

FIG. 2A shows a schematic diagram of the editing shift register of FIG. 1 while FIGS. 2B and 2C show two alternative magnetic overlay bubble implementation configurations for the editing shift register.

DETAILED DESCRIPTION OF THE PREFERRED EMBODMENTS

Figure 1:
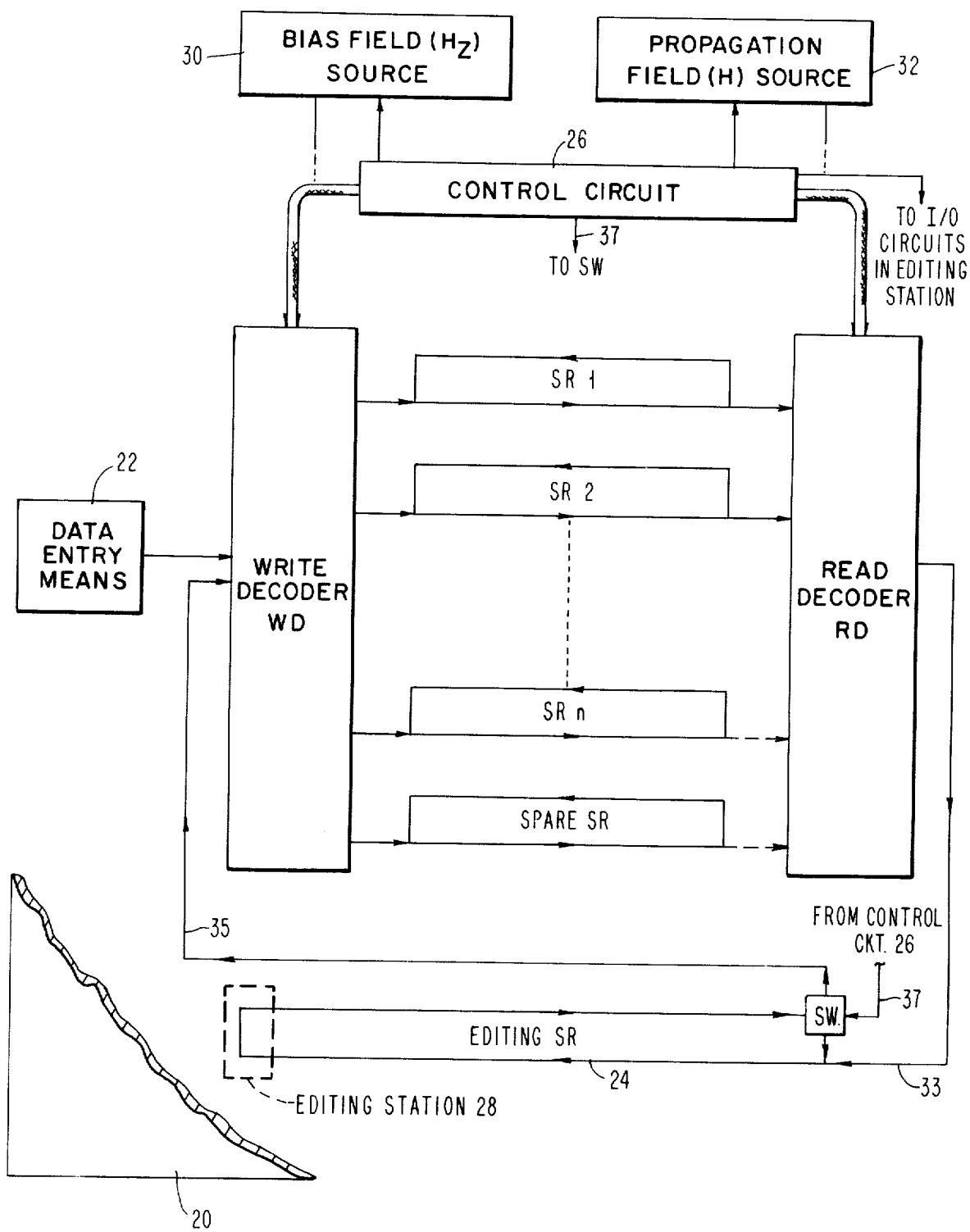
FIG. 1 shows a system configuration for a text editing system.

FIG. 1 shows a system organization for a text editing system in which various data manipulative functions can be performed. This system is comprised of a plurality of components for storage and movement of magnetic bubble domains in a magnetic medium 20, which could be any medium capable of supporting magnetic bubble domains therein. This type of magnetic medium is well known in the art, and is, for example, a garnet material or an amorphous magnetic bubble domain material. As will be appreciated more fully later, when an embodiment using charge coupled devices is used, the medium 20 is a semiconductor medium, such as silicon, in which patterns of electrical charge can be moved.

These systems are comprised of a plurality of shift registers SR1, SR2 . . . SRn, which are used to store the information in the text. In addition to these shift registers, spare shift registers can be also provided, one of which is shown in FIG. 1.

A data entry means 22 is used to provide patterns of bubble domains to a write decoder WD. The data entry means can be any type of bubble domain circuit which provides a pattern of bubble domains representative of the text to be stored. For example, an encoder of the type shown in aforementioned copending application Ser. No. 469,927 can be used for the data entry means. Use of such encoder allows an operator to directly go from a keyboard to a bubble domain coded pattern.

Write decoder WD is connected to each of the shift registers SR1 . . . SRn and the spare shift register. The write decoder can be operated to send input data to any one of these registers in accordance with address signals supplied to the write decoder.

The shift registers SR1 . . . SRn and the spare shift register are connected to a read decoder RD. Depending upon the addresses supplied to the read decoder, information in any of the shift registers SR1 – SRn can be read out and supplied to the editing shift register 24, where data manipulation functions are performed.

Both the write decoder WD and the read decoder RD are known in the art and will not be described further here. Bubble domain implementations for these decoders are described in U.S. Pat. Nos. 3,689,902, and 3,701,125.

The decoders WD and RD are provided with address inputs from a control circuit 26. These inputs determine which of the shift registers SR1 . . . SRn and the spare shift register are to be activated for putting data into these registers and removing data from these registers. Control circuit 26 is well known in the art and can comprise electronic circuitry for storing and transmitting the addresses desired for operation of the text editing system of FIG. 1.

The editing shift register 24 is a long shift register which has approximately twice the length of any of the storage shift registers SR1 . . . SRn. This register 24 is used to perform the data manipulation functions on the text which is selectively taken from any of the registers SR1 . . . SRn. In particular, register 24 includes an editing station 28 in which the data manipulative functions are performed. The editing station includes a detector for sensing the data bits, apparatus for inserting new data bits, apparatus for deletion of data bits, and an apparatus for exchanging or changing the order of the data bits. A switch SW is used to remove data from the editing shift register 24. The removed data then moves to decoder WD, via propagation path 35. Switch SW is a conventional current controlled switch of the type shown in aforementioned U.S. Pat. No. 3,701,125. Current inputs from control circuit 26, via conductor 37, are used to change the state of switch SW. Operation of the editing shift register will be explained with respect to FIGS. 2A–2C and FIGS. 3A–3D.

The control cicuit 26 also provides inputs to a bias field source 30 and a propagation field source 32. Source 30 provides the bias field $H_z$ normal to the magnetic bubble domain medium 20. As is well known in the art, this magnetic field is used to stabilize the size of domains in the system. It can be provided by any of a number of well known means, including current carrying coils and permanent magnets.

The propagation field source 32 provides a reorienting magnetic field H which is in the plane of magnetic medium 20. In the system to be described herein, the field H is a rotating magnetic field which is regular; i.e., it does not have to be stopped or reversed or even altered in order to achieve all data manipulation functions. As such, this is a distinction over the prior art relating to data reordering schemes, and is an important engineering advantage, as was explained previously.

OPERATION OF THE EDITING SHIFT REGISTER (FIGS. 2A–2C AND 3A–3D)

When it is desired to perform data manipulation functions on the text, the information to be modified is read from the shift register in which it is stored and is propagated along path 33 to the editing shift register 24. Register 24 is approximately twice the length of any of the storage registers SR1 . . . SRn. This enables the contents of two of the storage registers to be placed into the editing shift register, in situations where corrections are to extend between more than one of the storage shift registers SR1 . . . SRn. After being edited, the data leaves the editing shift register 24, via path 35, and is brought to the write decoder WD, which places it into the proper register SR1 . . . SRn. Operation of the switch SW, in response to a signal on line 37 from the control 26, causes domains in the editing shift register 24 to leave this register and travel to decoder WD, via path 35. The editing of text includes the alteration of the substance of the contents of the text and the rearrangement of the order of the contents of the stored text. Alteration consists of clearing and writing data, the latter involving input/output operations. The rearrangement of data order involves positioning, deletion, insertion, and exchange of characters or lines. These operations will be described in more detail with respect to FIGS. 2A–2C and 3A–3D.

The deletion, insertion, or exchange of data always requires the displacement of a data section from the rest of the data. Deletion of a bit of information is synonomous to clearing the information and then closing the gap which has been left. Insertion of a data bit is the creation of a bit space and then the writing of a bit into that space. Dynamic shift registers, such as magnetic bubble domain shift registers and charge coupled device registers, continuously circulate all the data stored in them. Hence, the relative displacement of data is achieved by temporarily freezing a section of the stored data.

EDITING SHIFT REGISTER

The editing shift register is shown schematically in FIG. 2A. This register is provided with two alternate paths, a normal path 34 and a bypass path 36. Bubble domains usually move along the normal path. In this figure, bit positions are schematically indicated by the blocks having the bits A, B, C, etc. in them.

A bit is written, cleared, or read at a convenient position (called the I/O position 28). Any number of I/O positions can be utilized and the position of these I/O stations is arbitrary.

Rearrangement of data order is performed by freezing a bit (or bits) at the I/O station, and at the same time activating the bypass loop. After this, the bits at the I/O station are de-frozen and then allowed to revert to their normal propagation path. Before those bits are de-frozen, they may be altered at the I/O station by electronic or magnetic means. Other data is diverted to the bypass path 36 where it can move past the frozen bits in the I/O position. Upon de-freezing the bypass will be deactivated; the previously frozen bits are now allowed to continue propagating in the shift register, but will have a different position relative to the other bits in the shift register than they had prior to the freezing operation.

FIG. 2B shows a design for achieving freeze and bypass operations. In this case, a magnetic bubble domain shift register is comprised of T and I bars 38, together with two Y bars 40 and 42. These Y bars are used for cornering. Two current loops 44 and 46 are used by bypassng and freezing bits of data respectively. The current conductor loops 44 and 46 receive inputs from the control cricuit 26 (FIG. 1). A writing means 48 is comprised of the permalloy domain generator G, a permalloy I-bar 50, and a write control loop 52, which receives current inputs from control circuit 26. Domains produced by generator G will move to pole 4' on Y-bar 40, unless they are annihilated by a field produced by current in conductor 52. Also, a sensor 54 connected to a utilization means 56 is provided for sensing the bubble domain pattern in the editing shift register 24. The sensor can be any known type of domain sensor, such as a magnetoresistive sensor, while the utilization means is an apparatus such as a data processor.

Figure 2C:
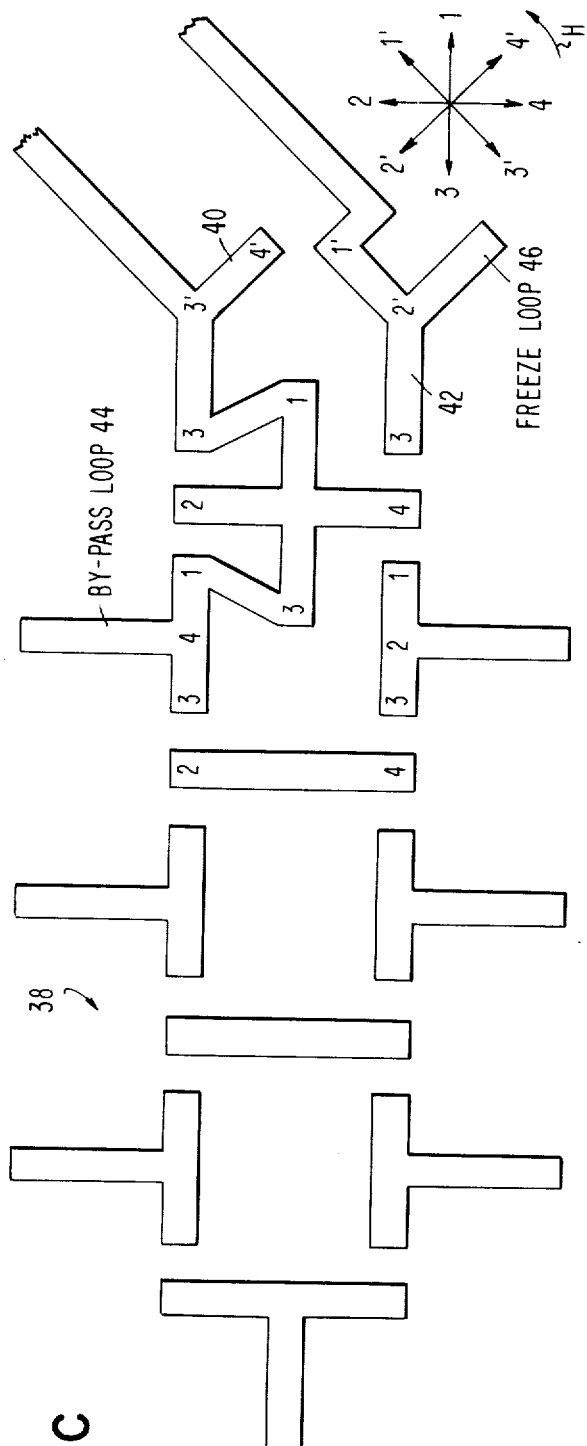

FIG. 2C shows a single level metallurgy configuration for achieving an editing shift register structure. Here, the register is comprised of a T and I bar pattern 38 which is similar to the pattern shown in FIG. 2B. However, the bypass loop 44 and the freeze loop 46 are conductors which are deposited directly on the permalloy Y bar elements 40 and 42. Current through the conductor loops 44 and 46 will not impair the movement of bubble domains around the shift register. For ease of illustration, the writing means 48 and sensor 54/util. means 56 are not shown in FIG. 2C.

Figure 3A:
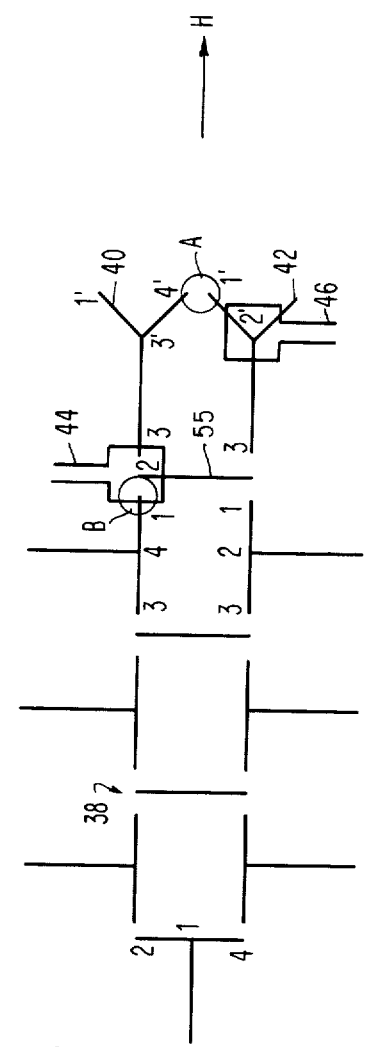
FIGS. 3A–3D illustrate the operation of the editing shift register for data manipulation.
Figure 3B:
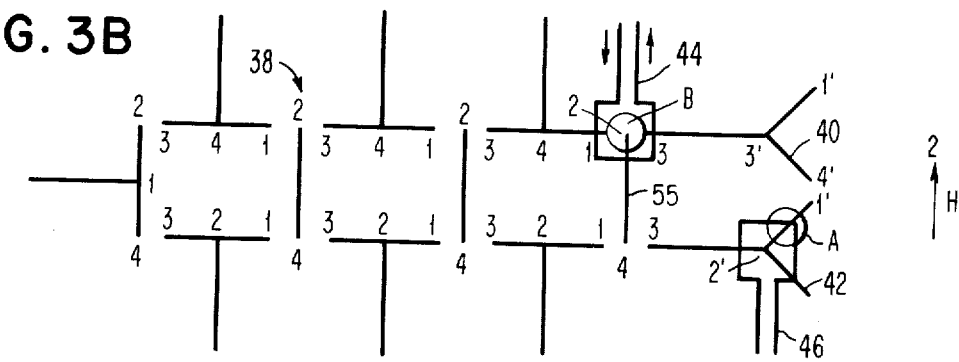
Figure 3C:
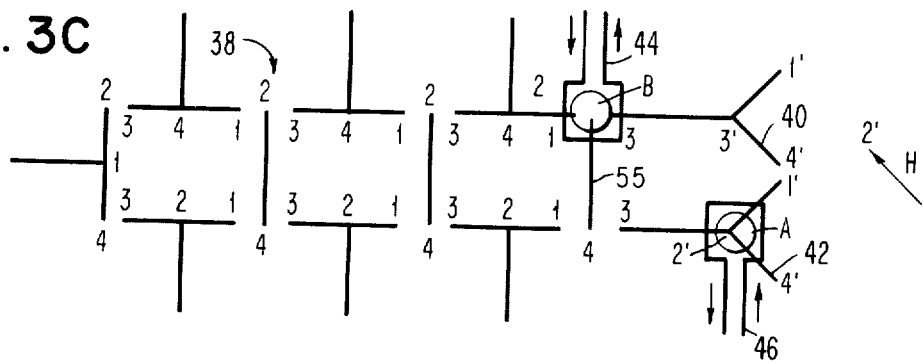
Figure 3D:
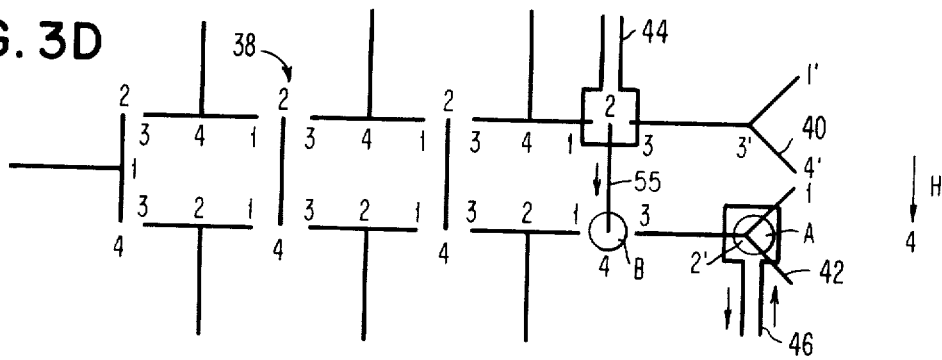

FIGS. 3A – 3D show the movement of bubble domains during one rotation of the in-plane magnetic field H, when freezing and bypassing operations are executed. Initially, bubble domain B follows bubble domain A in a clockwise direction around the shift register. During phase 1 of the drive field H, bubble domains A and B reside at the positions shown in FIG. 3A. From phase 2 through phase 3' (see the field H pattern in FIGS. 2B, 2C), the bypass current loop 44 is activated to retain bubble B within loop 44 (FIGS. 3B and 3C). During phase 4 of field H, the bypass current in loop 44 is removed to allow bubble B to slide down I bar 55, thus achieving bypass FIG. 3D).

A freezing current is applied starting at phase 2' of a field H and is continually applied for one complete field rotation cycle. At that time, the freezing current in loop 46 is removed which allows bubble A to follow bubble B around the editing shift register.

In the editing shift register I/O position, sensor 54 is provided for detection of the information. Additionally, writing means 48 can be provided for insertion of new information. Current through the freeze loop 46 can be increased in value in order to collapse (delete) a bubble domain held there. Thus, the I/O position can be used for the location of a plurality of components for changing the data order or for changing the data itself.

CHARACTER MANIPULATION

In this section, the exchange, deletion, and insertion of characters within a single line will be considered. One character is usually represented by 6 or more bits, therefore, one character track usually means 6 or more synchronized bit tracks. In these figures, only one bit track is shown for ease of illustration. A line which is to be changed is first moved into the editing shift register. As noted, the editing shift register is equipped with freeze and bypass current loops as well as being equipped with a generator for inserting new information. Deletion of information can be achieved by annihilating the information using a current loop, or by using an increased current magnitude in the freeze loop. For illustration in the followng examples, an 8-character line having the initial status shown in FIG. 2A is assumed for the examples which are summarized in TABLE 1. Character A is assumed to be the beginning of that line and only one direction of shifting (clockwise) is permitted. The examples described in the following table will be explained in more detail especially with reference to FIGS. 2A, 2B, and 3A – 3D.

Table 1

CHARACTER MANIPULATION
The rightmost bit is amenable to freeze action, while its adjacent bit is amenable to bypass action.

| Examples | | SR Actions | SR Status |
|---|---|---|---|
| 0. | Initial status (see FIG. 2A) | 1. Quiescent | EDCBA_H_ |
| 1. | Exchange B and C | 1. Shift 4 positions | A_H_EDCB |
|  |  | 2. Freeze and bypass 1 position | CA_H_EDB |
| 2. | Extract and insert B between D and E | 1. Shift 4 positions | A_H_EDCB |
|  |  | 2. Freeze and bypass 2 positions | DCA_H_EB |
| 3. | Close gap between E and H | 1. Freeze and bypass 1 position | HEDCBA___ |
| 4. | Delete C and close gap | 1. Shift 5 positions | BA_H_EDC |
|  |  | 2. Annihilate | BA_H_ED_ |
|  |  | 3. Freeze and bypass 4 positions | H_EDBA__ |
| 5. | Insert a space between B and C | 1. Shift 2 positions | H_EDCBA_ |
|  |  | 2. Freeze and bypass 2 positions | BAH_EDC_ |
| 6. | Insert F between B and C | 1. Shift 2 positions | H_EDCBA_ |
|  |  | 2. Freeze and bypass 2 positions | BAH_EDC_ |
|  |  | 3. Write | BAG_EDCF |

EXCHANGE OF CHARACTERS

Example 1 in the table describes the exchange of two adjacent characters B and C. To do this, the editing shift register is shifted by 4 positions to bring character B into the I/O station. The freeze and bypass loops 46 and 44 are then activated for one cycle of the field H. That is, character B is frozen for one cycle of field H and then defrozen, and only character C is allowed to bypass character B. This is equivalent to an extraction of B and a reinsertion of B between characters C and D.

Similarly, B can be inserted into any other desired position. For example, example 2 of the table describes the situation when B is extracted and then reinserted between D and E. In this example, the freeze and bypass loops are activated for two cycles of the field H to allow B to exchange with C and then with D. From this, it is obvious that the operation of extraction and reinsertion of a character into any position can be applied repeatedly for the purpose of sorting the characters in a line into any desired order. Thus, the editing shift register can be used to rearrange the order of data into any desired sequence.

DELETION OF CHARACTERS

Since no bit positions are removed or created in a shift register during its operation, the removal of a space is interpreted as the movement of that space to the end of the line (i.e., the position preceding A). In FIG. 2A, the character preceding A is indicated as a blank box indicative of the space. This is illustrated by example 3 of the table where the gap is closed between characters E and H. To do this, the shift register freezes and bypasses 1 bit to achieve the shift register status HEDCBA_.

In example 4 of the table, C is brought to the I/O station by shifting it five bit positions. In the I/O station it can be annihilated conveniently by passing a large current through the freeze loop 46 when C is in that loop. As an alternative, another conductor loop can be used to annihilate bits which are in the I/O position. The space left by the deletion of character C is then inserted at the end of the line by freezing and bypassing four bits, as shown in the table. Similarly, any number of characters can be deleted by placing these characters into the I/O position, annihilating the characters, and then closng the gap as explained previously.

INSERTION OF NEW INFORMATION

To insert a new bit into a line is interpreted as extracting a space at the end of the line (i.e., the space preceding A) and reinserting that space into the desired position in order to write in the new bit at the space. Therefore, it is assusmed that the last character of the line is a space to accommodate insertion of new information without losing old information (FIG. 2A).

Example 5 of the table shows that a space between A and H is extracted and reinserted between B and C, by shifting two bits so that the space is brought into the I/O position, followed by a freezing of that space and a bypass of two bits (A and B) past this space. The space is then returned to the shift register, being then in a position between B and C.

Example 6 illustrates the insertion of a new character F in the space now created between B and C. As described, a space is created between B and C (Example 5) after which the newly inserted space is moved to the I/O station where character F is written in. This writing operation is performed by the generator G, in combination with I bar 50 and I/O control line 52 (FIG. 2B).

EXCHANGE OF THE TOTAL CONTENTS OF REGISTERS

An exchange of the contents in any of the storage shift registers SR1 . . . SRn can be easily done using the decoders WD and RD. This exchange is done readily by using the spare shift register, rather than by using the editing shift register 24.

However, it should be understood that the editing shift register can be used to exchange the data bits in any of the storage shift registers SR1 . . . SRn.

For instance, assume that it is desired to exchange the contents of shift registers SR1 and SR2. To do this, the contents of SR1 are connected to decoder RD and then are sent through editing shift register 24 and back to decoder WD. This decoder then places that information into the spare shift register. After this, random access of the contents of SR2 enables these contents to be removed and propagated, via path 34, to the decoder WD. When proper addresses are received from control circuit 26, the contents taken from SR2 are then placed into SR1. At this time, the contents in the spare shift register (from SR1) are read out by decoder RD and follow path 34 back to decoder WD. The write decoder then places that information into register SR2, thereby completing the exchange of information between registers SR1 and SR2.

As will be noted for this example of an interchange of information between storage shift registers, the structure of FIG. 1 using the decoders provides a powerful tool for quickly accessing information which is to be modified. Rather than having to use the editing shift register for exchange of the data between these registers, the information exchange can be quickly accomplishd using the read and write decoders in the random access mode of operation.

The editing shift register can be used with the decoders to provide another useful operation. In this situation, two lines of data which are only partially full, can be merged into one line in the editing shift register. As an example, two lines of data which are one-half empty can be merged into one line in the editing shift register, then moved to the write decoder which restores the information to the proper shift register.

FIG. 4

Figure 4:
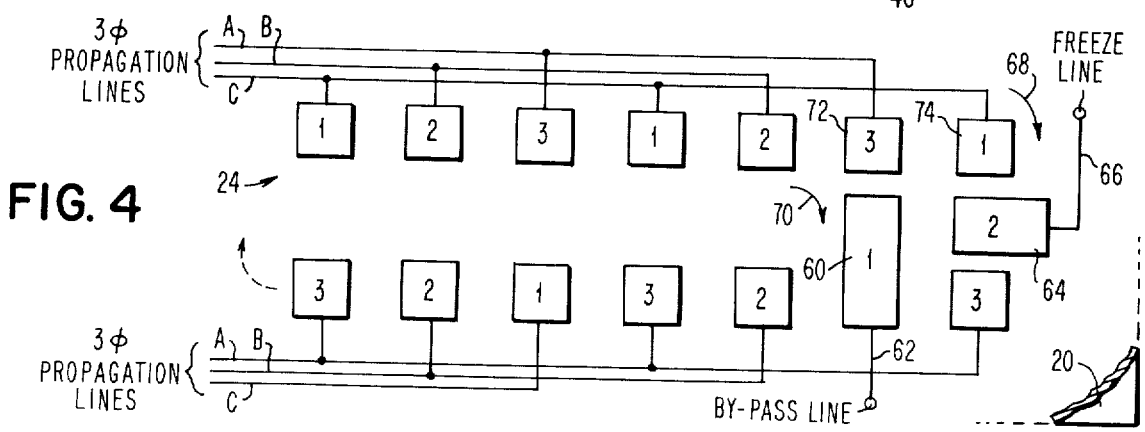
FIG. 4 is an illustration of an editing shift register which is implemented using charge coupled devices.

FIG. 4 shows an embodiment for the editing shift register 24, using charge coupled devices for the dynamic shift register. In this example, three phase propagation lines A, B, C are used to move information in the register. The blocks having the data bit positions 1, 2, 3, 1 etc. represent charge coupled devices which are sequentially activated to move charge along. From this diagram, it is apparent that successive repetition of the current pulses in the three phase propagation lines A, B, C will move charge from one bit position to the next in semiconductor medium 20 in order to provide a closed loop shift register.

Bit position 60 (FIG. 4, is used for bypass operations and is connected to a bypass line 62. Bit position 64 (FIG. 4) is used for the freezing operation and is connected to the conductor 66. In normal operation, bits of charge representing information travel along the path indicated by arrow 68. Bits which are to bypass frozen information travel in the path indicated by arrow 70. These operations and the paths followed by the charge bits are the same as those followed by the bubble domain bits discussed with respect to FIGS. 3A–3D.

If it is desired to perform a freeze operation, the charge which is at device 64 during phase 2 is held there by a drop in voltage potential on line 66. This drop in potential is sufficiently large to provide a more stable location for the charge so that it remains there even though the three phase propagation sequence continues. During this time, subsequent bits of charge are made to move along direction 70 to complete a bypass operation by lowering the potential at bit position 60 sufficiently. This makes it more attractive to the charge from position 72 after phase 3, so that the charge will go to bit position 60, rather than going to bit position 74 during phase 1 of the propagation cycle.

After the information to be sent through the bypass path 70 has flowed through this path, the low potential on the freeze line 66 can be raised to the normal level so that the charge which has been bypassed by other charge can now be de-frozen and resume its normal path around the shift register 24. Concurrently, the potential on line 62 is raised so that the charge at 72 will go to the preferred next position 74.

Thus, it is readily apparent to those of skill in the art that the dynamic shift register configurations described more particularly with respect to bubble domain embodments can also be provided by charge coupled embodiments in which the information bits are moving electrical charges. Further, it will be noted by those of skill in the art that the three phase propagation scheme used for movement of charge in the embodment of FIG. 4 does not involve a reversal or a change in any way in the three phase propagation sequence of pulses which are applied to the propagation lines A, B, C. Therefore, the data manipulation functions can be performed at the same time that charge is being moved around the shift register and in the storage shift registers, as was the situation described previously with respect to the bubble domain embodiment.

This is a system where information bits are moved in dynamic shift registers using a regular sequential drive field which is not reversed, stopped or altered. This simplifies the peripheral electronics used for control and also permits the use of tank circuit drives when large rotating field energy is needed for large storage capacity. The device is used for editing and sorting data and the devices for storing information are compatible in design and are hosted in the same storge medium in order to realize integrated circuit chips.

What has been described is a text editing system employing either magnetic bubble domain dynamic shift registers or charge coupled device dynamic shift registers. Those having skill in the art will be able to design components other than the specific ones offered here to achieve the same type of functions.

The present system offers flexible storages to facilitate the input, output, retrieval, and revision of data. In addition, the system provides a wide range of data manipulation functions and facilitates the timing controls and character encoding. This system is an example of the use of a single technology for applications using a mix of large portion data storage and small portion data processing. Process control, file sorting, and file management in disk or tape-like storages are other possibilities.

The structure described herein can be used in more complex editing systems in which format codes are used to determine paragraphs, sentences, words, margin justification, and centering. Additionally, the storage shown herein is adaptable to many differnt character sets. With the availability of inexpensive large capacity memory chips, this text editing system can be very useful for character sets with large numbers of symbols, such as are employed in the Chinese language. In this regard, the rewritable decoder described in copending application Ser. No. 429,411, (filed Dec. 28, 1973,) when properly modified to serve as an encoder, may be used as a convenient keyboard entry means for many different character sets.

When an editing shift register of the type described herein is used in combination with a major/minor loop memory configuration as shown in U.S. Pat. No. 3,618,054, two-dimensional data sorting can be achieved. To achieve this, each minor loop of that memory and the major loop of that memory are made to be editing shift registers. operation of this type of modified memory is based on the principles described herein.

What is claimed is:

1. A text editing apparatus for manipulation of data bits representing said text, comprising:
storage means for dynamically storing said data bits in a single host medium,
deletion means for deleting portions of said data bits in a line of data bits in said host medium,
insertion means for inserting new data bits into said line of data bits in said host medium,
adjusting means for adjusting a gap between data bits of said line of data bits in said host medium,
propagation means for moving said data bits in said host medium,
drive means for providing a fixed repetitive sequence of drive fields for moving said data bits in said host medium, said sequence of drive fields being unchanged during the operation of said storage means, deletion means, insertion means, adjusting means, propagation means, and drive means.

2. The apparatus of claim 1, where said host medium is a magnetic medium and said data bits are bubble domains.

3. The apparatus of claim 2, where said drive pulses are produced by a magnetic field in the plane of said magnetic medium, said magnetic field being a rotating magnetic field of sustantially constant amplitude whose rotation is not interrupted or reversed during the operation of said text editing apparatus.

4. The apparatus of claim 1, where said host medium is a semiconductor medium and said data bits are comprised of electrical charge.

5. The apparatus of claim 4, where said drive pulses are a fixed sequence of electrical signals, said sequence of electrical signals not changing in repetitive order.

6. A text editing system, comprising in combination:
a plurality of dynamic shift registers for dynamically storing magnetic bubble domain patterns representative of said text in a single magnetic medium,
means for placing patterns of bubble domains into said dynamic shift registers,
means for removing bubble domains from said dynamic shift registers,
an editing shift register for alteration of said data in said magnetic medium, said editing shift register including freeze means for holding the position of some of said magnetic bubble domains, bypass means for advancing bubble domains ahead of said bubble domains held by said freeze means, and gap adjustment means for adjusting the gap between bubble domains in said editing shift register,
magnetic field means for producing a rotating magnetic field which acts on said dynamic shift registers and on said editing shift register and which has a constant direction of rotation, said magnetic field producing the motion of said bubble domains in said dynamic shift registers and in said editing shift register.

7. An apparatus for manipulating magnetic bubble domains in a single magnetic medium, comprising:
a plurality of bubble domain storage positions and means for continually moving said bubble domains from one storage position to the next in said magnetic medium in response to a magnetic field,
means for providing said magnetic field across the entire magnetic medium in the plane of said medium which continually rotates in a constant direction for a plurality of 360° cycles of rotation,
means for holding said bubble domains in fixed positions in said magnetic medium during the rotation of said magnetic field,
means for bypassng domains which are held in said fixed positions as said magnetic field rotates,
means for adjusting the gap between successive bubble domains which are moved in said magnetic medium as said magnetic field rotates.

8. The apparatus of claim 7, where said means for bypassing and said means for holding are comprised of current carrying conductors.

9. An apparatus for manipulation of electrical charge in a single semiconductor medium, comprising:
a plurality of devices for dynamically holding said electrical charge, and means for moving said electrical charge from one device to another in said semiconductor medium,
means for providing a fixed sequence of drive fields for moving said electrical charge in said semiconductor medium,
means for holding electrical charge at a fixed position in said semiconductor medium during said fixed sequence of drive fields,
means for bypassing charge which is held at said fixed positions during the application of said fixed sequence of drive fields,
means for adjusting the gap between successive electrical charges which are moved in said semiconductor medium during the application of said fixed sequence of drive fields.

10. The apparatus of claim 9, where said means for bypassing and said means for holding said charge is comprised of conductor lines.

11. The system of claim 6, where said freeze means is comprised of a first electrical conductor located adjacent to a first bit position of said editing shift register, and said bypass means is comprised of a second electrical conductor located adjacent to a second bit position of said editing shift register wherein electrical current through said first and second conductors will produce magnetic fields which will cause bubble domains located at said first and second bit positions to remain at said bit positions during rotation of said magnetic field, said bypass means further including means for moving a bubble domain at said second bit position to a bit position in said editing shift register in advance of said first bit position, thereby bypassing a bubble domain held at said first bit position by said freeze means.

* * * * *